United States Patent [19]

Brennan

[11] Patent Number: 4,845,357

[45] Date of Patent: Jul. 4, 1989

[54] METHOD OF ACTUATION AND FLIGHT CONTROL

[75] Inventor: Brian W. Brennan, Burlington, Vt.

[73] Assignee: Simmonds Precision Products, Inc., Wilmington, Del.

[21] Appl. No.: 154,767

[22] Filed: Feb. 11, 1988

[51] Int. Cl.[4] .......................... H01J 5/16; H01J 40/14
[52] U.S. Cl. ................................................. 250/227
[58] Field of Search ............. 250/227, 231 R; 73/705; 300/311, 317; 340/550, 555

[56] References Cited

U.S. PATENT DOCUMENTS

| | | | |
|---|---|---|---|
| 4,614,752 | 9/1986 | Davis | 250/227 |
| 4,678,904 | 7/1987 | Saaski et al. | 250/227 |
| 4,678,905 | 7/1987 | Phillips | 250/227 |
| 4,739,661 | 4/1988 | Bucholtz | 250/227 |
| 4,743,752 | 5/1988 | Olsen et al. | 250/227 |

Primary Examiner—David C. Nelms
Assistant Examiner—William L. Oen
Attorney, Agent, or Firm—Dale R. Lovercheck

[57] ABSTRACT

The method of the invention provides for actuating at least one actuator, such as a piezoelectric transducer in response to movement of a waveguide, such as an optical fiber. In a preferred embodiment of the invention, both the piezoelectric member and the optical fiber are connected to a structure. The connection is such that movement of the structure is detected by corresponding variations in and/or back scattering from light transmitted into the optical fiber. The piezoelectric member is actuated in response to the movement of the structural member as detected by the variations in the light in passing through the optical fiber. The actuation of the piezoelectric member may effect a dampening of the initial structural movement. Alternatively, monitoring the light passing through the fiber may be used as feed back on the position of the structural member, which in turn may be used to reposition the structural member by further actuation of a piezoelectric member.

23 Claims, 6 Drawing Sheets

METHOD OF ACTUATION AND FLIGHT CONTROL

BACKGROUND OF THE INVENTION

The invention relates to controlling the movement of a structure. More particularly, the invention provides a method by which piezoelectric actuators, which are mounted or embedded on or in a structure adjacent to waveguides, such as optical fibers, provide controlled movement of such structures.

Optical fibers and piezoelectric actuators are well known. An opto-acoustic fuel quantity gauging system is disclosed by Ellinger in U.S. Pat. No. 4,677,305 (assigned to Simmonds Precision Products, Inc.). Griffiths in U.S. Pat. No. 4,654,520 issued Mar. 31, 1987 discloses a structural monitoring system using fiber optics. The use of microbend transducers which include mechanical amplifiers to facilitate detections of remote structural forces is disclosed by Asawa, et al. in U.S. Pat. No. 4,421,979. These transducers are located at discrete points on a structure. An optical fiber free of the structure is engaged periodically by the transducers so that reflections are only detectable from discrete locations. However, the structure is not moved by the transducers.

Kiraly in U.S. Pat. No. 4,400,642 discloses piezoelectric composite materials, in which a laminated structural device has the ability to change shape, position and resonant frequency without using discrete motive components. Kiraly cites Croswell, Jr. U.S. Pat. No. 3,930,626 as disclosing the use of structural wires employed to control the angular configuration of a fluid control system. Kiraly mentions that according to Croswell the structural elements that will expand or contract to produce curvature of the aerodynamic surface may include piezoelectric materials.

It is an object of the invention to provide a method of operating a piezoelectric member in response to movement of an optical fiber.

It is an object of the invention to provide a method of moving piezoelectric members in a structural member, such as an airfoil, in response to a signal produced from light emitted into optical fiber embedded in the airfoil.

BRIEF DESCRIPTION OF THE INVENTION

The method of the invention provides for actuating at least one actuator, such as a piezoelectric member in response to movement of a wave guide, such as an optical fiber. In a preferred embodiment of the invention, the piezoelectric member and the optical fiber are connected to a structure. They may be attached to or embedded in the structure. The connection is such that movement of the structure is detected by corresponding variations in light passing through the optical fiber. The piezoelectric member is actuated in response to the movement of the structural member as detected by the variations in the light passing through the optical fiber. The actuation of the piezoelectric member may effect a dampening of the initial structural movement. Alternatively, monitoring the light passing through the fiber may be used as feed back on the position of the structural member, in which in turn may be used to reposition the structural member by further actuation of a piezoelectric member. The piezoelectric member (or element) functions as an actuator. It may be a piezoceramic, such as lead zironate titanate (chemical formula $PbTiZrO_3$ and sometimes referred to as PZT).

The invention provides a method of monitoring and controlling physical movement occurring at any point between spaced points on a structure. These steps include first, attaching at least one piezoelectric means and at least one optical fiber continuously to said structure to extend from at least one of the spaced points to the other and thereby engage all points along the structure between said spaced points so that physical movement of the structure between said spaced points will result in physical movement of the optical fiber. Second, passing a light signal into said optical fiber. Third, detecting reflection changes in said light signal resulting from said physical movement to thereby provide an indication that a physical movement has taken place and an indication of the location and magnitude of said movement. Forth, activating said piezoelectric means to control said physical movement.

DETAILED DESCRIPTION OF THE INVENTION

The invention provides a method of operating a piezoelectric actuator, which is connected to a structure, in response to movement of the structure. Structures actuated by piezoelectric members controlled by waveguides, such as optical fibers in accordance with the present invention may include metal sheeting, framing, polymeric, (organic or inorganic) composite or other suitable material. Preferred organic polymeric materials include thermoplastic and thermoset polymers. These materials may include a matrix of metal, or example aluminum, thermoplastic such as polyetherether ketone (PEEK), thermoset polymer or ceramic. A preferred composite structure includes high strength filaments or fibers in a polymeric matrix such as a crosslinked epoxy or maleinide.

Epoxy resins are well established for use in making high performance composite structures which include high strength fiber. Preferred fiber materials are metal, glass, boron, carbon, graphite, (continuous or chopped filaments) or the like, such as disclosed by Chu et al in the U.S. Pat. No. 4,677,305. Structures made of these composites can weigh considerably less than their metal counterparts of equivalent strength and stiffness.

The optical fibers for use in accordance with the invention may be wound onto or into reinforcing filaments as the structure is fabricated. The structures may be fabricated as taught by Gill et al (assigned to Hercules Incorporated) in U.S. Pat. No. 4,581,086. Such structures may be thin walled and include aircraft wings and missile fins. Helical applicators may be used to deposit a ply or plies of continuous filaments into the form of the structure as taught by Gill et al in U.S. Pat. No. 4,519,869 (Assignee, Hercules Incorporated). Alternatively, multiphase epoxy thermosets having rubber within a disperse phase may be used to make structures, such as airfoils, as taught by Bard (assigned to Hercules Incorporated) in U.S. Pat. No. 4,680,076. Optical fibers and piezoelectric members may be embedded in or attached to these structures during fabrication. Attachment to the structures of the optical fibers and piezoelectric members after construction may be carried out using the same or a different matrix material than is used to fabricate the underlying structure.

Other matrix compositions which may be used to make structures in accordance with the present invention include poly(arylacetylene) as disclosed by Jaboloner in U.S. Pat. Nos. 4,070,333; and 4,097,460; and French in U.S. Pat. No. 4,144,218 (each assigned to Hercules Incorporated). Chu, et al. in U.S. Pat. No. 4,656,208, (assigned to Hercules Incorporated), discloses thermosetting epoxy resin compositions and thermosets therefrom.

The invention is now described with reference to the drawings wherein FIGS. 1–8 show preferred embodiments of the invention. With more particular reference to FIG. 1, a system 1 for use in accordance with the invention is shown. Embedded in the structure 10 is optical fiber 12.

Figure 1:
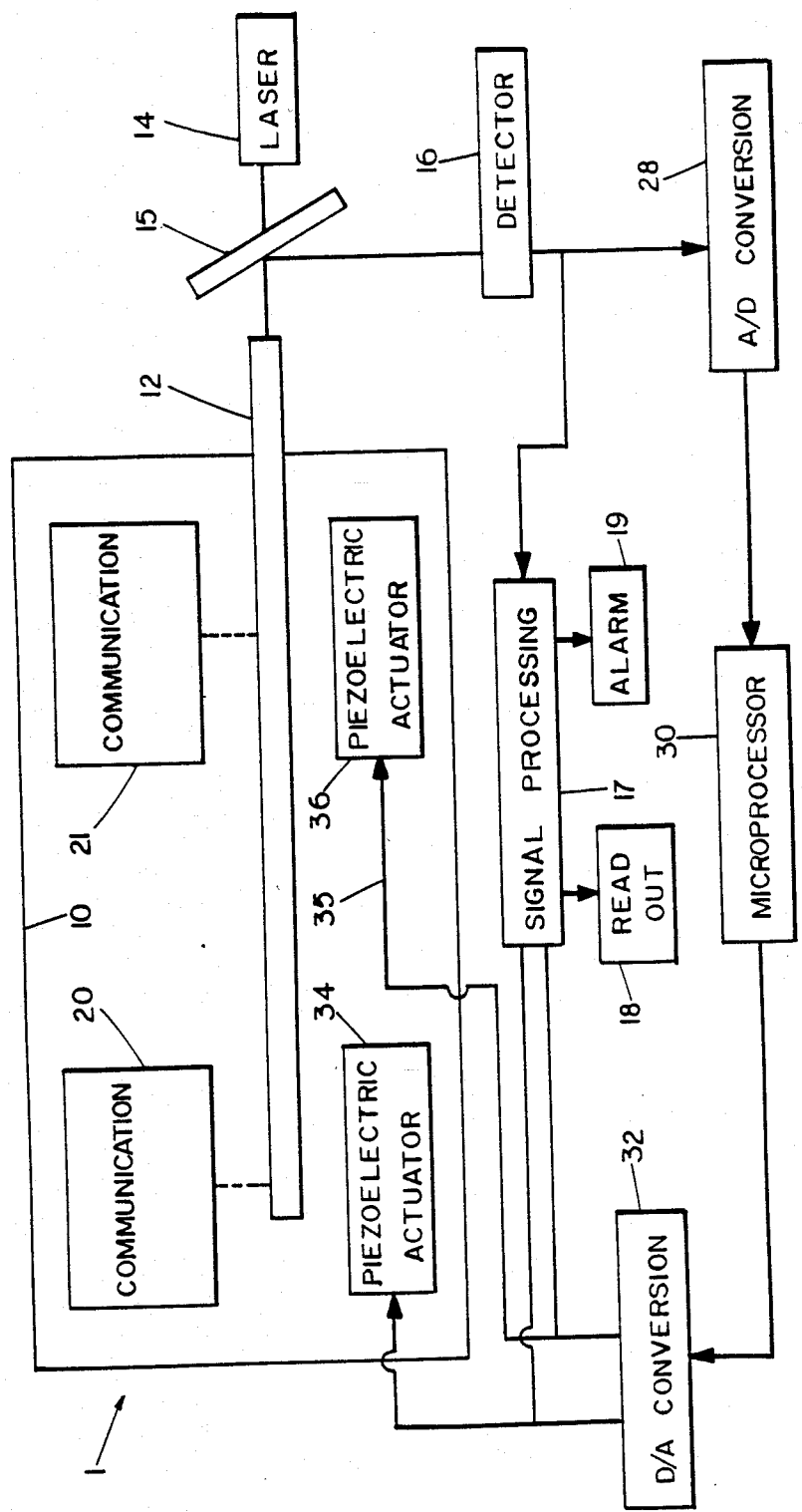
FIG. 1 is a schematic representation of a system for fiber optical control of piezoelectric actuation in accordance with the invention.

Appropriate means are provided for passing a light signal into one end of the optical fiber. In FIG. 1, this means constitutes a laser 14. Also provided are means for detecting and indicating changes in the light signal provided by the laser 14. The detector 16 receives back scattered light coupled out by the system by coupler 15. Signal processing electronics 17 may be used as an alternative to or backup for the digital processing discussed herein below. The detector 16 would normally be a photodetector arrangement. The detected changes in the signal can be read out as indicated by the block 18. By presetting given limits, an alarm 19 can be caused to sound should the detected changes exceed the preset limits.

It will be understood that any type of physical movement of the optical fiber, such as slight bending, will have an effect upon the back scattering of light from the introduced light signal along the optical fiber. Thus, various parameters can be detected, such as back scattering sites, discontinuities, attenuation, and the like. Changes in these parameters result from the physical connection of the optical fiber 12 to the structure 10 and occur as a consequence of physical movements of the structure 10.

Techniques for indicating the magnitude and location of such changes in the physical characteristics of an optical fiber per se are well known in the art. For example, U.S. Pat. No. 4,243,320 discusses a method for testing optical fibers in which reflected signals produce self-coupling in a laser used to provide the original signal. This self-coupling changes the lasing activity. Any change in the lasing activity will be an indication of a change in the reflection parameter. Thus, the position from which light is reflected in an optical fiber can be determined by simply monitoring the lasing activity. The present invention provides a combination of an optical fiber, piezoelectric actuator and a structure to enable that structure to be monitored for strain.

The optical information is converted to digital form in A/D converter 28 and fed into the microprocessor 30. Control signals from the microprocessor 30 are converted in digital to analog converter 32 to analog electrical signals and applied to piezoelectric elements 34 and 36. Alternatively, the analog signal from the optical sensor can be directly converted into a control signal for the piezoelectric actuators.

Piezoelectric material can be manufactured by solidifying piezoelectrically polar substances in the presence of an applied electric field to align the polar structure. This ability to manufacture piezoelectric materials, such as titanates, or lithium niobate, facilitates the fabrication of structures using piezoelectric composite materials made in accordance with the present invention. Preferably various piezoelectrically active and electrically conductive composite layers are assembled in specific orientations as a laminated structural member. The structure comprises a layer of a piezoelectrically active material laminated to another layer of a similar material as taught in U.S. Pat. No. 4,400,642.

It is envisioned that this closed loop structural orientation control system would have applicability in a wide range of areas, especially in the aerospace industry. There it could be applied to the dynamic control of vibrations in space structures or for fine tuning of telescopes and antennas. Another possible use would be for dynamic microcontrol of airfoil surfaces in aircraft.

The piezoelectric actuator members 34 and 36 are individually actuated by the signals they receive through lines 33 and 35 to move the structure 10. This movement of the structure 10 is in turn monitored by following the corresponding changes in the parameters of the light passing through the fiber 12, which are again detected by detector 16 and processed in the microprocessor 30. The microprocessor 30 may send further signals to the piezoelectric actuator members to further resposition the structure 10.

The communication units 20 and 21 include receivers and transmitters which receive and transmit signals from remote transceivers. The receivers and transmitters may be adapted to transmit and receive light signals or radio waves to and from a remote location. The signals received are converted to light which travels through fiber 12 to detector 16 where they are converted to an electrical signal. The electrical signal is converted in A/D converter 28 and processed in microprocessor 30. The microprocessor 30 sends signals to the piezoelectric actuators 34 and 36 to actuate them in response to signals received from the remote transceivers. The system shown in FIG. 1 is thus adapted to actuate the piezoelectric actuators 34 and 36 to move the structure 10 in response to signals from a remote transmitter (or transceiver).

Figure 2:
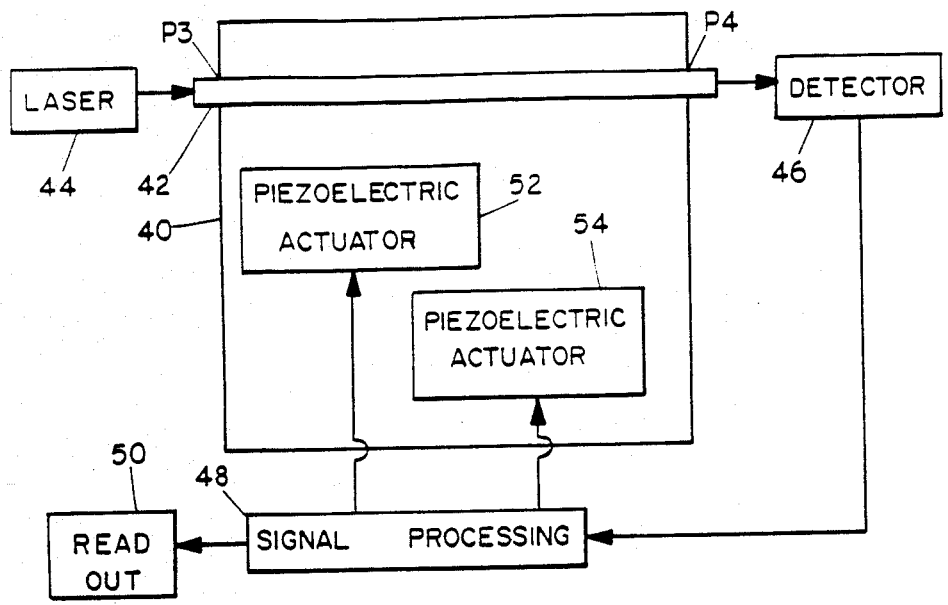
FIG. 2 is a schematic representation of a system having fiber optic control of piezoelectric actuation in accordance with the invention.

Referring now to FIG. 2, there is shown structure 40 to which an optical fiber 42 is attached between spaced points P3 and P4. In this embodiment, pulsed light from a laser shown at 44 is passed into one end of the optical fiber 38 and the detecting means is positioned to pick up the transmitted light at the other end. This detecting means includes a detector 46 and appropriate signal processing electronics indicated by the block 48. which is connected to read-out display 50.

The signal processing electronics 48 is connected to the piezoelectric elements 52 and 54 which are embedded and/or attached to the structure 40. The piezoelectric members used in accordance with the invention may include lithium niobate as taught by Kiraly in U.S. Pat. No. 4,400,642. The signal from the detector 46 is processed in signal processing electronics 48 and a signal is conveyed to piezoelectric actuators 52 and/or 54. These elements move in response to the signal. The signal conveyed to the elements 52 and 54 is proportioned to provide a precise movement of the structure 40. This movement may, for example, dampen vibration in the structure or otherwise precisely move the structure, which may include optical reflector or lens. Alternatively, the structure may be an airfoil of an aircraft or missile.

In the embodiment of FIGS. 2, the changes detected are changes in the transmission characteristic of the light signal. In both FIGS. 1 and 2, the light signal provided by the laser blocks introduced into the optical fiber can be either continuous, pulsed or polarized (such as from a polarized LED) or a combination thereof. The light propagation in the optical fiber itself can be either single or multi mode. As mentioned, the changes in transmission, reflection, back scattering polarization, attenuation and scattering loss and the like of the light signal resulting from physical movement of or pressure on the optical fiber itself, as a result of the physical movements of the structure, can be detected. The magnitude and location of the physical movement or pressure causing effect can thus be determined. The light signal injection technique, such as optical-time domain reflectometry (OTDR), and optical fiber signature transmission measurements are similar to those used in the manufacture and testing of optical fibers or for the assessment of field distribution along such optical fibers.

When a physical movement is to be monitored (for example using the the monitoring system of FIG. 1), pulsed light can be employed and the change in the reflected (or back scattered) light signal is detected. The magnitude of the reflected signal is proportional to the strain introduced by the physical movement. The location or position of the strain change is determined, in turn, by the time it takes for the light signal to make a round tip from its starting point at one end of the fiber to the point of the strain change resulting from the physical movement of the structure and back to the starting point. In the embodiment described, it is the back scattering of light resulting from light loss at the point of physical movement or strain change that is detected. Such back scattering is known as Rayleigh reflections as opposed to the aforementioned Frenel type reflections which appear in the form of spikes. Since the speed of light in the fiber optic is known, the distance from the one end of the fiber optic cable to the disturbance or location of the physical movement of the structure is easily computed.

The sensitivity of the fiber optic to a physical movement or strain related deflection can be greatly increased by making use of a phenomenon known as "microbending". This phenomenon can be briefly explained as follows. Essentially, an optical fiber functions as a waveguide. It normally includes a core surrounded by a cladding of material having a lower index of refraction from that of the core. Light is thus internally reflected at the interface of the core and cladding and generally precluded from escaping from the core. The light is thus essentially propagated or guided down the core. Imperfections at any point along the cladding will result in a change in its refractive index. This change, in turn, permits some light to escape, representing loss; reflections also occur at such discontinuity and these reflections, as mentioned, are termed Rayleigh back scattering. By subjecting the cladding to strain, the aforementioned change in refractive index can be induced from a point on the surface of the cladding. This disturbance will create the same effect as imperfections and result in light loss by accentuating microbending and Rayleigh reflections.

Figure 3:
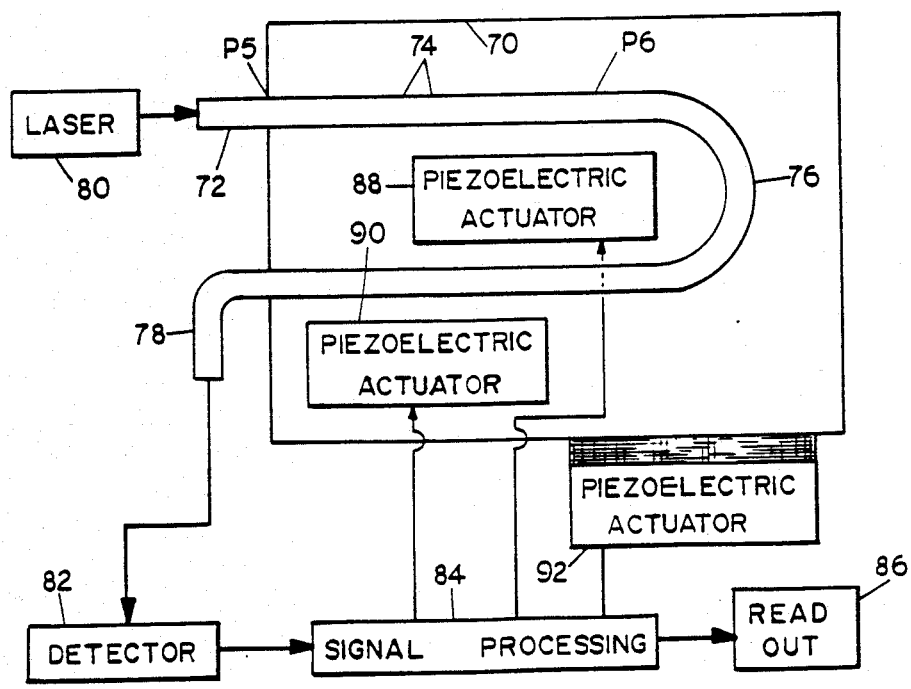
FIG. 3 is a schematic representation of the embodiment of the system shown in FIG. 2 but with alternative optical fiber positioning.

Referring now to FIG. 3 there is illustrated another arrangement for monitoring and controlling movement of a structural member using piezoelectric actuators, an optical fiber and light signal transmission characteristics. In this embodiment, there is shown a structure 70 having spaced points defined as P5 and P6. An optical fiber 72 is continuously secured to the structure 70 as indicated at 74 to pass between the points P5 and P6. In this embodiment, the other end of the optical fiber 72 adjacent to the point P6 reverses at 76 and returns to a point 78 adjacent to the one point P5 to define a loop. A light signal is passed into one end of the optical fiber 72 as indicated by the laser block 80 and changes in the transmission characteristics of the light signal are detected at the other end 78 as by a dectector 82 and cooperating signal processing electronics indicated by the block 84 connecting to read-out 89. The blocks 82, 84, 86 may be the same as the correspondingly number blocks shown in FIG. 2.

The signal processing electronics 84 is connected to embedded piezoelectric actuators 88 and 90 and attached piezoelectric actuator 92. The piezoelectric actuators used in accordance with the invention are preferably ceramic, such as crystalline barium titanate ceramic as disclosed by Kiraly in U.S. Pat. No. 4,400,642 at column 1, lines 45–86 in discussing Croswell, Jr. U.S. Pat. No. 3,885,758. As discussed above, the piezoelectric actuators moe by bending in response to the signal from signal processing electronics 84.

In FIG. 3, the first portion of the optical fiber 72 is shown attached to the structure 70 between the points P5 and P6 while the reverse portion forming the loop is not indicated as attached. This showing indicates that it is not essential that all of the length of the optical fiber be attached to the structure but rather only that portion or section of the optical fiber along the structure to be monitored defined between appropriate end points. However, it should be understood that the reversed or looped portion could be secured to the structure at a spaced location so that different structural portions of the structure can be monitored by the same optical fiber. In this respect, it should be understood that the particular structural path to be monitored need not be straight but can follow any particular path such as bracing members in towers or platforms which can zig-zag back and forth or other nonlinear structures.

It will also be noted that there is a portion of the optical fiber 72 free of the structure 70 between the laser 80 and the structure. This portion 72 of the optical fiber is shown in FIG. 3 to indicate that the light source for providing a light signal can be located remotely from the structure itself, the light signal being transmitted through the optical fiber to pass into the optical fiber portion between the first and second points. Similarly the detecting apparatus can be located remotely from the structure itself.

The significance of the measurements in all of the embodiments described thus far is that of change. In other words, the optical fiber signature as determined by back scattering, reflection and the like such as in the embodiment of FIG. 1, or, the light signal transmission characteristics such as in the embodiments of FIGS. 2 and 3, are determined when the structure is in a reference condition. It is the change in such light signature or light transmission characteristic that constitutes the significant measurement. As mentioned, the optical fiber itself can take any path as long as the movement permitted along that path is representative of movement of that portion of the structure to be monitored.

Figure 4:
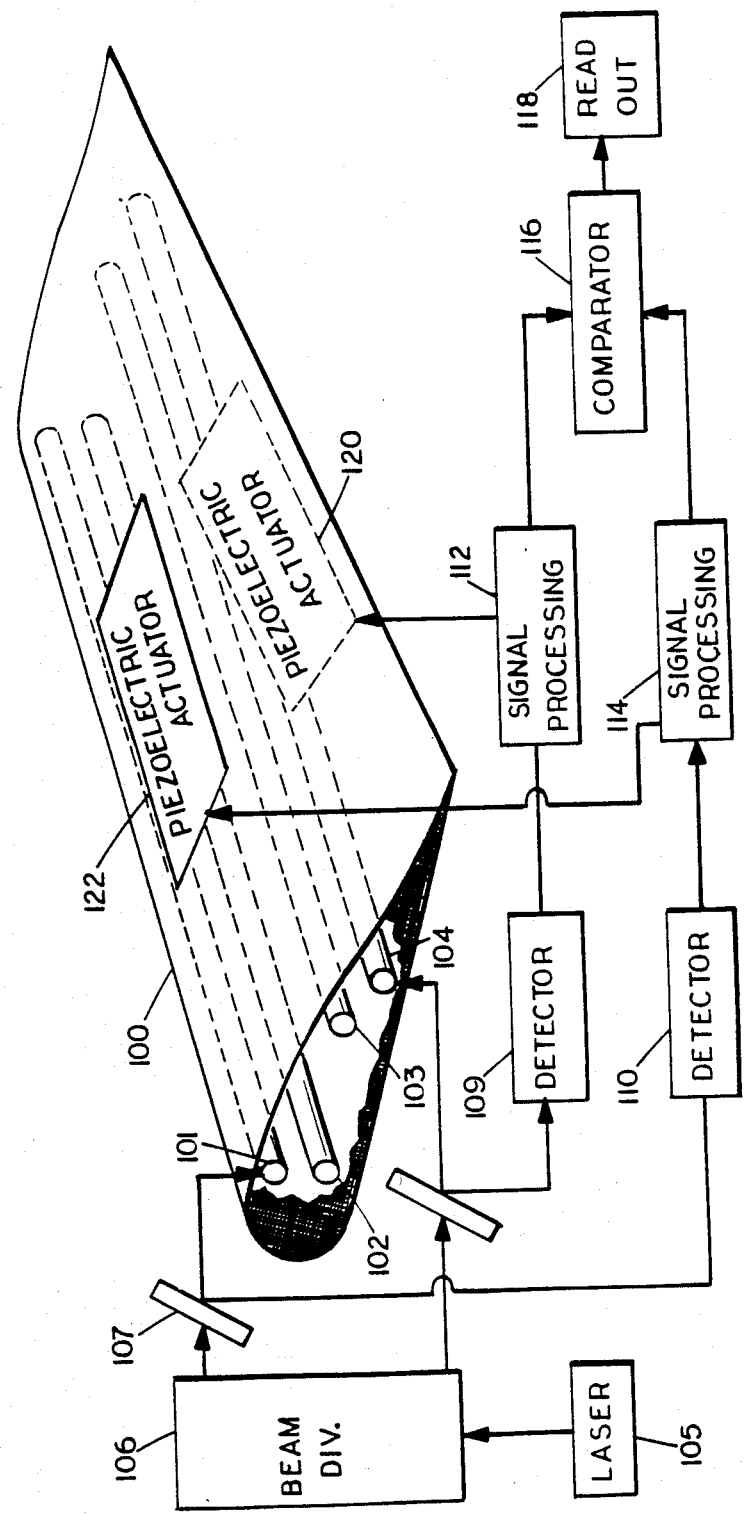
FIG. 4 is a schematic and perspective view of an airfoil structure in accordance with the invention.

Referring now to FIG. 4, there is shown a further embodiment of the present invention which will enable not only the location and magnitude of a physical movement to be measured bu also the direction of such movement.

As a specific example, there is shown in FIG. 4 a portion of a wing structure 100 in which four optical fibers indicated by the numbers 101, 102, 103 and 104 are embedded. The optical fibers are spaced in the structure 100. The optical fibers 101 and 104 extend along the top side and the optical fibers 102 and 103 extend along the bottom side. Light is introduced into fibers 101 and 104 from laser 105 and beam divider 106 providing identical light beams passing into couplers 107 and 108. Back scattering reflection charcteristics are coupled out and passed into detectors 109 and 110 for the respective optical fibers 101 and 104 from which the signals are then appropriately processed in blocks 112 and 114. The output from the blocks 112 and 114 pass to a comparator 116 wherein an appropriate computation is made to determine the direction of any physical movement of the wing affecting the optical fibers 101 and 104. An appropriate read out 118 indicates the direction of movement.

The signal processing electronics 112 is connected to embedded piezoelectric actuator 120. The signal processing electronics 114 is connected to attached piezoelectric actuator 122. The piezoelectric actuators move by bending in response to the signal processing electronics. This bending may be used to modify the direction of flight of the structure, or dampen vibration therein.

More particularly, it will be appreciated that should the structure 100 bend at a certain section of the leading edge of the wing, the optical fiber 101 will experience a bending movement having a given radius of curvature. Similarly, the other optical fiber 102 will experience a bending as a result of the bending of the structure 100 but the radius of curvature of this bending will be larger.

Thus, for example, the optical fiber 101 at a given point will experience a compression while the optical fiber 102 at a given point will experience a stretching. These changes result in changes in the light signal, and the changes in the light signals themselves are different in that one will indicate a compression and the other an extension. Thus, a vector or direction of the deformation as well as its magnitude and location can be computed. Similarly, the direction of lateral movements can be determined by the second pair of optical fibers 102 and 104, shown in FIG. 4 by utilizing similar light introducing and detection circuits.

Figure 5:
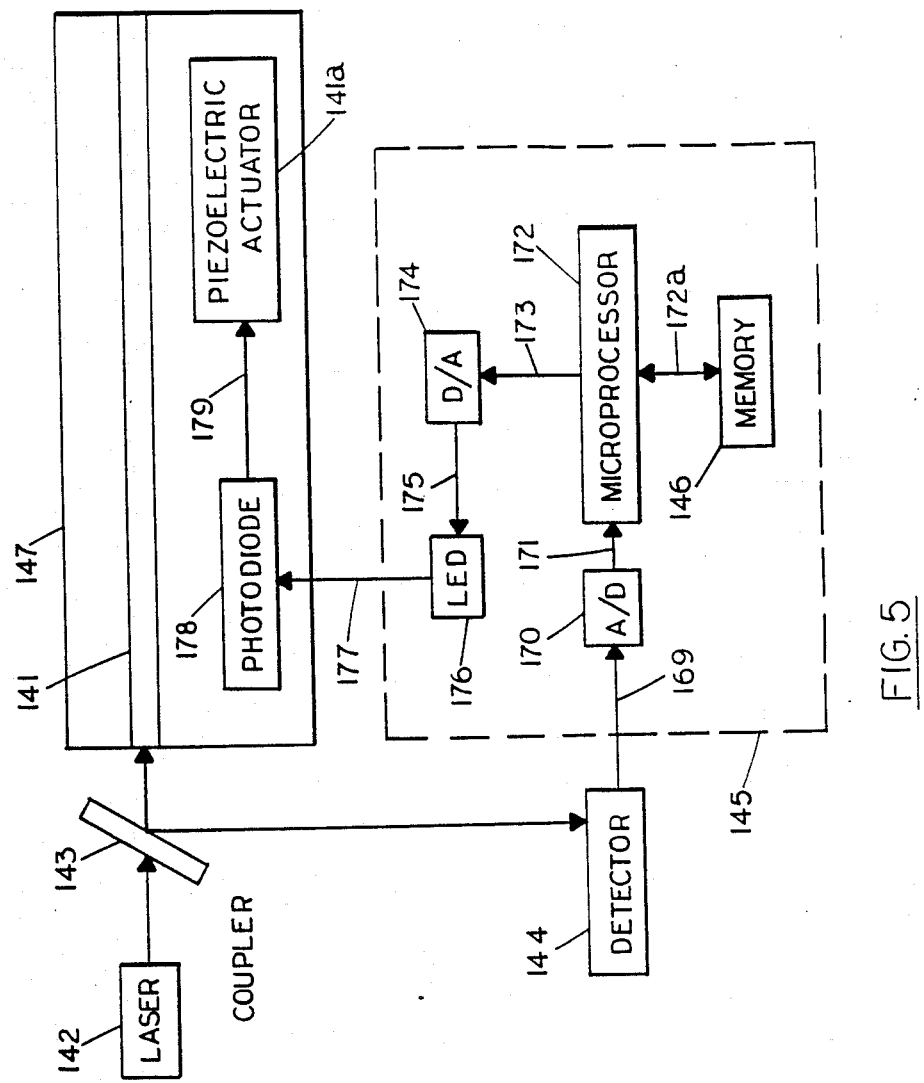
FIG. 5 is a block diagram of a system for fiber optic control of piezoelectric actuation in accordance with the invention.

Referring now to FIG. 5, there is shown a still further technique of structural monitoring in accord with the present invention. An optical fiber 140 into which a light signal from a laser 142 is passed through coupler 143. Reflection, back scattering and the like from the light signal passing down the optical fiber 141 make up the optical fiber "signature" of the light signal and this "signature" is detected in the detector 144 while the optical fiber 141 is positioned in a predetermined given path or configuration free of any structure. The piezoelectric actuators 141a and 141b are connected to the signal processing electronics 145.

The output from detector 144 for the light "signature" is passed into the signal processing electronics block 145 and then stored in a memory 146. It will now be understood that memory 146 includes the "light signature" for the light in the optical fiber 141 when this optical fiber follows a specific path.

The detector 144 is connected by electrical current conductor 169 to analog to digital converter (A/D) 170. Converter 170 is connected to microprocessor 172 by conductor 171. Microprocessor 172 is connected by conductor 172a to memory 146 and by conductor 173 to digital to analog converter (D/A) 174. Converter 174 is connected by conductor 175 to light emitting diode (LED) 176. Light emitting diode 176 is connected to photodiode 178 by optical fiber 177. Photodiode 178 is connected by conductor 179 to piezoelectric actuator 141a.

Figure 6:
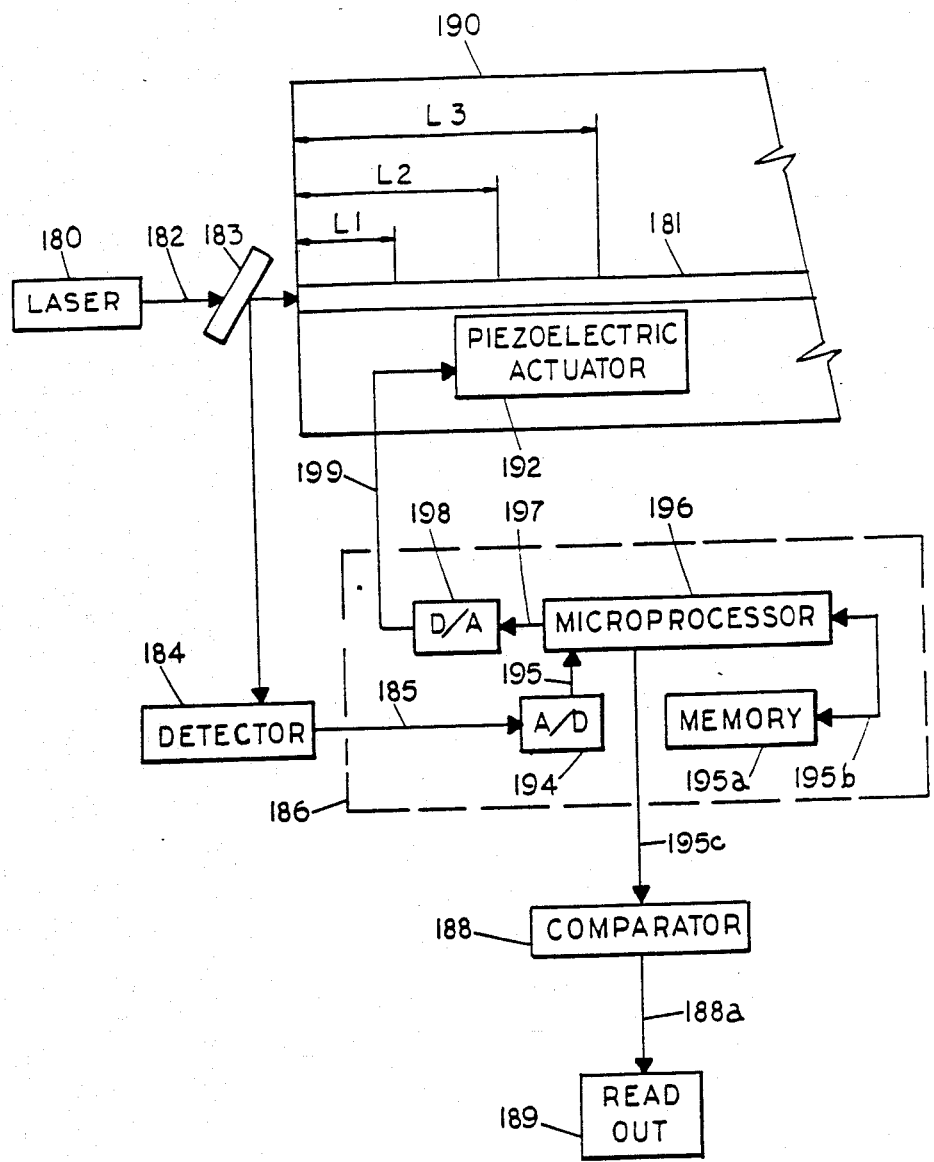
FIG. 6 is a block diagram of a system for fiber optic control of piezoelectric actuation in accordance with the invention.

In FIG. 6, laser 180 emits light 182 through coupler 183 into optical fiber 181. Reflected light from fiber 181 is deflected from coupler 183 to detector 184. Detector 184 is connected to signal processing electronics 186. Signal processing electronics 186 is connected to comparator 188. Comparator 188 is connected by conductor 188a to readout 189. Detector 184 is connected by conductor 185 to analog to digital converter (A/D) 194. Converter 194 is connected by conductor 195 to microprocessor 196. Microprocessor 196 is connected to memory 195a by conductor 195b and to comparator 188 by conductor 195c. Microprocessor 196 is connected by conductor 197 to digital to analog converter (D/A) 198. Converter 198 is connected by conductor 199 to piezoelectric actuator 192.

The output of the signal processing electronics 186 in FIG. 6 passes to a comparator 188 for a comparison with the data stored in the memory 195a as a consequence of measurements previously made in the fiber 181 in the structure 190. It will now be appreciated that any physical movement of the structure 190 resulting in a shifting of the optical fiber 181 from its predetermined path will give rise to a signal that is different from that stored in the memory 195a. This difference will be detected by the comparator 188 and can be displayed or printed in the read-out 189.

FIG. 6 illustrates a further feature of the present invention which can be applied to the other embodiments described. Thus, with reference to the optical fiber 181 secured to the structure 190, it will be noted that there are provided markers which are defined as predetermined types of discontinuities or interruptions in the optical fiber 141 to provide a distinctive type of reflective signal in the light signatures, known as Fresnel reflections, which can be easily detected. These "markers" are indicated as being uniformly spaced along the optical fiber 181 to demark given distances such as L1, L2 and L3.

With the foregoing arrangements, there will be provided definite standards in the detected reflected light signal corresponding to known distances; that is, locations along the optical fiber. These standards can thus be used to maintain the location determining accuracy of the monitoring equipment.

It will be understood that the comparison measurements described in FIGS. 5 and 6 are for those situations wherein it is desired to detect a deviation of a structure from a given configuration wherein the information for the desired configuration has previously been stored.

Figure 7:
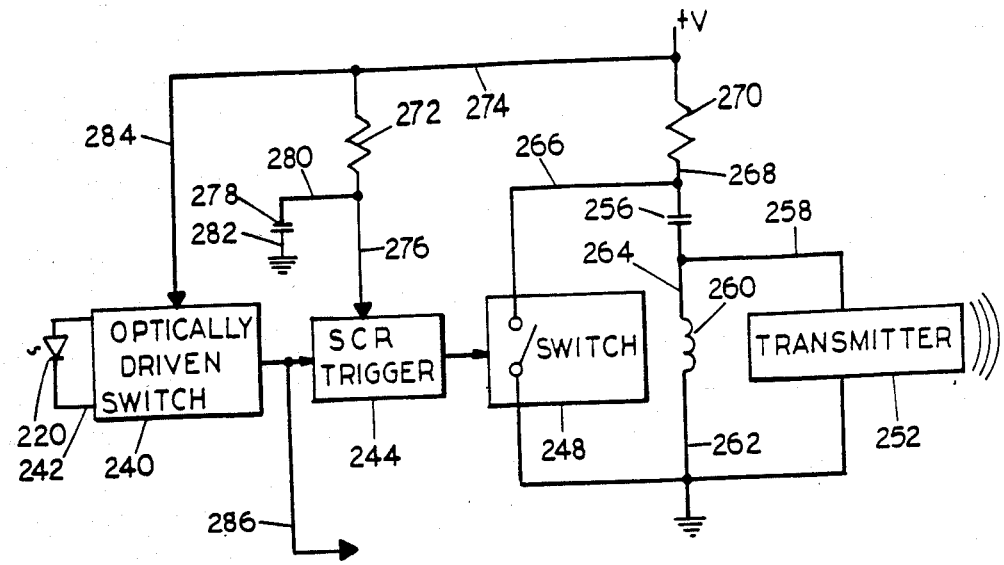
FIG. 7 shows a schematic representation of a transmitter circuit for fiber optic control of piezoelectric actuation in accordance with the invention.
Figure 8:
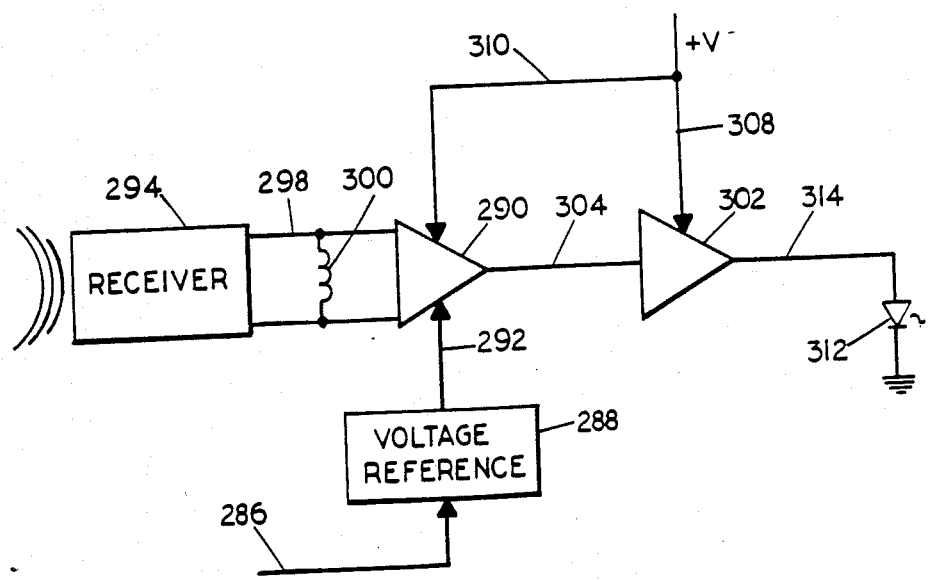
FIG. 8 shows a schematic representation of a receiver circuit for fiber optic control of piezoelectric actuation in accordance with the invention.

FIG. 7 shows a preferred embodiment of a transmitter circuit for the communication system 20 and 21. FIG. 8 shows a preferred embodiment of a receiver circuit for the communication system 20 and 21. With more particular reference to FIG. 7, it would seem that the photo diode 220 is connected to the optically driven switch 240 by line 242. Optically driven switch 240 is connected to SCR trigger 244 by line 246. SCR trigger 244 is connected to high current switch 248 by line 250. High current switch 248 is connected to transmitter 252 by line 254. Transmitter 252 may be a wave or light wave transmitter. Transmitter 252 is connected to capacitor 256 by line 258. Conductor 260 is connected in parallel with transmitter 252 by lines 262 and 264. Capacitor 256 is connected through line 266 to high current switch 248. Capacitor 256 is connected to line 268 to resistor 270. Resistor 270 is connected to resistor 272 through line 274. Resistor 272 is connected to SCR trigger 244 through line 276. Resistor 272 is connected to capacitor 278 through line 280. Capacitor 278 is connected to ground through line 282. Resistor 270 and resistor 272 are connected to the optically driven switch 240 through line 284.

The optically driven switch 240 is connected through line 286 to voltage reference 288 as shown in FIGS. 7 and 8. Voltage reference 288 is connected to the amplifier limiter 290 through line 292. The receiver 294 is connected to the amplifier 290 through lines 296 and 298. The receiver 294 may be a radio wave or light wave receiver. The inductor 300 is connected to line 296 and line 298. The voltage to current converter 302 is connected to the amplifier limiter 290 through line 304. The voltage to current converter 302 is connected to positive voltage +V through line 208. Amplifier limiter 290 is connected to positive voltage +V through line 310. The infrared light emitting diode (LED) 312 is connected to voltage-to-current converter 302 through line 314. Light from infrared light emitting diode (LED) 312 is transmitted through a fiber optic cable to optical detectors 16.

Various further applications and modifications falling within the scope and spirit of this invention will occur to those skilled in the art. The method and apparatus accordingly are not to be thought of as limited to the specific embodiment set forth merely for illustrative purposes.

What is claimed is:

1. A method of actuating a portion of a structure, comprising:
   providing an actuation system, said actuation system comprising a piezoelectric actuator member and an optical fiber, and actuating said actuator member in response to movement of said optical fiber.

2. The method of claim 1 wherein said movement comprises deformation of said waveguide.

3. The method of claim 1 wherein said actuator comprises a piezoelectric member and further comprising providing a structural member, and embedding at least one of said waveguide and said actuator in said structural member.

4. The method of claim 1 wherein said actuator comprises a piezoelectric member and further comprising providing a structural member, and attaching at least one of said waveguide and said piezoelectric member to said structural member.

5. The method of claim 3 wherein said structural member comprises fiber.

6. The method of claim 3 wherein said structural member comprises filament.

7. The method of claim 5 wherein said structural member further comprises resin.

8. The method of claim 7 wherein said fiber comprises carbon, graphite, metal or glass.

9. The method of claim 3 wherein said structure is an airfoil.

10. The method of claim 4 wherein said structural member is an airfoil.

11. The method of claim 1 wherein said waveguide comprises an optical fiber.

12. A method of moving an aircraft airfoil during flight comprising:
   providing an aircraft in flight, a light source,
   an optical fiber,
   a light detection means,
   a piezoelectric means, and
   a signal processing emans,
   said aircraft comprising an airfoil
   said piezoelectric means and said optical fiber being connected to said airfoil,
   emitting light from said light source into said optical fiber, and detecting at least a portion of said light in said detector means,
   conveying a signal from said light detection means to said signal processing means, and
   actuating said piezoelectric means in response to a signal from said signal processing means whereby said airfoil is moved sufficiently by said piezoelectric means to control the direction of flight of said aircraft.

13. The method of claim 12 wherein said airfoil is a missile fin means.

14. The method of claim 13 wherein said airfoil is an aircraft wing means.

15. A method of monitoring and control of physical movement occurring at any point between spaced points on a structure including the steps of:
   (a) embedding at least one piezoelectric means in said structure,
   (b) embedding at least one optical fiber continuously in said structure said optical fiber extending from at least one of the spaced points to the other and thereby engage all points along the structure between said spaced points so that physical movement of the structure between said spaced points will result in physical movement of the optical fiber, said piezoelectric means not being in contact with said optical fiber;
   (c) passing a light signal into said optical fiber;
   (d) detecting reflection changes in said light signal resulting from said physical movement to thereby provide an indication that a physical movement has taken place and an indication of the location and magnitude of said movement, and (e) activating said piezoelectric means to control said physical movement.

16. The method of claim 15 wherein said movement comprises deformation of said optical fiber and wherein said structure is an aircraft in flight and said activation of said piezoelectric means is sufficient to substantially effect the direction of said flight.

17. The method of claim 15, including the steps of detecting and storing characteristics of said light signal passing through said optical fiber when said optical fiber is positioned to follow a precise, predetermined path prior to attaching the optical fiber to said structure; and comparing the stored characteristics with detected changes in the light signal after the optical fiber has been attached to said structure in an identical path configuration, to thereby provide a measure of any subsequent deviations of the structure from said predetermined path.

18. A method of monitoring and control of physical movement occurring at any point between spaced points on an aircraft structue in flight including the steps of;
 (a) attaching a least one piezoelectric means and at least one optical fiber continuously to said structure to extend from at least one of the spaced points to the other and thereby engage all points along the structure between said spaced points so that physical movement of the structure between said spaced points will result in physical movement of the optical fiber;
 (b) passing a light signal into said optical fiber;
 (c) detecting reflection changes in said light signal resulting from said physical movement to thereby provide an indication that a physical movement has taken place and an indication of the location and magnitude of said movement, and
 (d) activating said piezoelectric means to control said physical movement.

19. The method of claim 18 wherein said movement comprises deformation of said optical fiber.

20. The method of claim 18 wherein said structure is an aircraft.

21. The method of claim 20 wherein said activating of said piezoelectric means is effective to significantly change the direction of flight of said aircraft.

22. A method of operating an actuator, comprising: providing an actuation system, said actuation system comprising an actuator member and an optical fiber, actuating said actuator member in response to movement of said optical fiber, said actuation system being connected to a structure whereby said actuating of said actuator member causes movement of said structure, and detecting said movement by monitoring changes in a property of light being propagated through said optical fiber.

23. The method of claim 22 further comprising controlling said movement of said structure by regulating said actuation of said actuator member in response to changes in a property of said light propagating through said optical fiber.

* * * * *

UNITED STATES PATENT AND TRADEMARK OFFICE
CERTIFICATE OF CORRECTION

PATENT NO. : 4,845,357

DATED : July 4, 1989

INVENTOR(S) : BRENNAN(BW) 1

It is certified that error appears in the above-identified patent and that said Letters Patent is hereby corrected as shown below:

Column 5, Line 40, first occurrence of " the " should be omitted

Signed and Sealed this

Twenty-fourth Day of April, 1990

Attest:

HARRY F. MANBECK, JR.

*Attesting Officer*  *Commissioner of Patents and Trademarks*

UNITED STATES PATENT AND TRADEMARK OFFICE
CERTIFICATE OF CORRECTION

PATENT NO. : 4,845,357            Page 1 of 6

DATED : July 4, 1989

INVENTOR(S) : BRENNAN(BW)

It is certified that error appears in the above-identified patent and that said Letters Patent is hereby corrected as shown below:

Column 1, Line 65, first occurrence of

" in " should be omitted

Column 2, Line 57, " or "

should read -- for --

Column 3, Lines 25 and 26, " Jaboloner "

should read -- Jabloner --

UNITED STATES PATENT AND TRADEMARK OFFICE
CERTIFICATE OF CORRECTION

PATENT NO. : 4,845,357
DATED : July 4, 1989
INVENTOR(S) : BRENNAN(BW)

It is certified that error appears in the above-identified patent and that said Letters Patent is hereby corrected as shown below:

Column 3, Line 43,  " by "

should read  --  of  --

Column 4, Line 45,  " resposition "

should read  -- reposition --

Column 5, Line 19,  " FIGS. "

should read  -- FIGURE --

UNITED STATES PATENT AND TRADEMARK OFFICE
CERTIFICATE OF CORRECTION

PATENT NO. : 4,845,357
DATED : July 4, 1989
INVENTOR(S) : BRENNAN(BW)

It is certified that error appears in the above-identified patent and that said Letters Patent is hereby corrected as shown below:

Column 5, Line 38, " distribution "

should read -- distributions --

Column 5, Line 47, " tip "

should read -- trip --

Column 5, Line 54, " Frenel "

should read -- Fresnel --

UNITED STATES PATENT AND TRADEMARK OFFICE
CERTIFICATE OF CORRECTION

PATENT NO. : 4,845,357
DATED : July 4, 1989
INVENTOR(S) : BRENNAN (BW)

It is certified that error appears in the above-identified patent and that said Letters Patent is hereby corrected as shown below:

Column 6, Line 28, " dectector "

should read -- detector --

Column 6, Line 41, " moe "

should read -- move --

Column 7, Line 19, " bu "

should read -- but --

UNITED STATES PATENT AND TRADEMARK OFFICE
CERTIFICATE OF CORRECTION

PATENT NO. : 4,845,357

DATED : July 4, 1989

INVENTOR(S) : BRENNAN (BW)

It is certified that error appears in the above-identified patent and that said Letters Patent is hereby corrected as shown below:

Column 7, Line 30, " charcteristics "

should read -- characteristics --

Column 10, Claim 12, Line 31, " emans "

should read -- means --

Column 11, Claim 18, Line 21, " structue "

should read -- structure --

UNITED STATES PATENT AND TRADEMARK OFFICE
CERTIFICATE OF CORRECTION

PATENT NO. : 4,845,357

DATED : July 4, 1989

INVENTOR(S) : BRENNAN(BW)

It is certified that error appears in the above-identified patent and that said Letters Patent is hereby corrected as shown below:

Column 11, Claim 18, Line 23, " a "

should read -- at --

Signed and Sealed this

Seventh Day of May, 1991

Attest:

HARRY F. MANBECK, JR.

*Attesting Officer*                *Commissioner of Patents and Trademarks*